United States Patent
Li et al.

(10) Patent No.: US 9,525,351 B2
(45) Date of Patent: Dec. 20, 2016

(54) INDUCTOR CURRENT SENSING IN A BUCK CONVERTER USING MULTIPLE FILTERS

(71) Applicant: Linear Technology Corporation, Milpitas, CA (US)

(72) Inventors: Jian Li, San Jose, CA (US); Yingyi Yan, Fremont, CA (US); Xu Zhang, Milpitas, CA (US); Zhouyuan Shi, Fremont, CA (US)

(73) Assignee: Linear Technology Corporation, Milpitas, CA (US)

( * ) Notice: Subject to any disclaimer, the term of this patent is extended or adjusted under 35 U.S.C. 154(b) by 52 days.

(21) Appl. No.: 14/755,336

(22) Filed: Jun. 30, 2015

(65) Prior Publication Data

US 2016/0164412 A1 Jun. 9, 2016

Related U.S. Application Data

(60) Provisional application No. 62/119,652, filed on Feb. 23, 2015, provisional application No. 62/087,094, filed on Dec. 3, 2014.

(51) Int. Cl.
*H02M 3/158* (2006.01)
*H02M 3/156* (2006.01)
*H02M 1/00* (2006.01)

(52) U.S. Cl.
CPC ........... *H02M 3/1588* (2013.01); *H02M 3/156* (2013.01); *H02M 2001/0009* (2013.01)

(58) Field of Classification Search
CPC ........... H02M 2001/009; H02M 3/156–3/1588
See application file for complete search history.

(56) References Cited

U.S. PATENT DOCUMENTS

| | | | | |
|---|---|---|---|---|
| 7,417,413 B2* | 8/2008 | Noma | ................... | H02M 3/156 323/284 |
| 8,159,205 B1* | 4/2012 | Latham, II | ............ | H02M 3/156 323/284 |

(Continued)

OTHER PUBLICATIONS

N. K. Hoang, X. D. Do, Y. J. Woo and S. G. Lee, "An area saving inductor current sensor with load transient enhancement in DC-DC converter," SoC Design Conference (ISOCC), 2014 International, Jeju, 2014, pp. 3-4.*

*Primary Examiner* — Harry Behm
*Assistant Examiner* — Peter Novak
(74) *Attorney, Agent, or Firm* — Patent Law Group LLP; Brian D. Ogonowsky

(57) ABSTRACT

In a current mode switching power supply, current through the inductor needs to be sensed to control the peak current. The inductor current includes a DC component and an AC component containing switching noise. To reduce the switching noise, the actual inductor current is sensed to generate a signal, and a first AC component is attenuated by a first RC circuit while not attenuating a first DC component. A second AC component is derived by applying the rectangular wave switch voltage, which is at the duty cycle of the regulator, to a second RC filter, which blocks a second DC component. The second AC component is much larger than the first AC component and does not contain switching noise. The large second AC component, the smaller "noisy" first AC component, and the first DC component are applied to the first RC circuit to create a low-noise inductor current signal.

16 Claims, 5 Drawing Sheets

(56) References Cited

U.S. PATENT DOCUMENTS

| | | | |
|---|---|---|---|
| 8,823,352 B2 | 9/2014 | Zhang | |
| 2013/0265025 A1* | 10/2013 | Hattori | H02M 3/1588 323/282 |
| 2016/0087531 A1* | 3/2016 | Zhang | H02M 3/1582 323/271 |

* cited by examiner

INDUCTOR CURRENT SENSING IN A BUCK CONVERTER USING MULTIPLE FILTERS

CROSS-REFERENCE TO RELATED APPLICATIONS

This application claims priority from U.S. provisional application Ser. No. 62/087,094, filed Dec. 3, 2014, and U.S. provisional application Ser. No. 62/119,652, filed Feb. 23, 2015, by the present inventors and assigned to the present assignee.

FIELD OF THE INVENTION

This invention relates to DC/DC converters and, in particular, to sensing the inductor current in a current mode switching power supply.

BACKGROUND

FIG. 1 illustrates one type of prior art current mode DC/DC switching power supply, also known as a current mode DC/DC converter. Many other converter configurations can also benefit from the present invention. The type of converter shown in FIG. 1 is a peak current mode converter.

The operation of the converter is conventional and is as follows.

A clock (Clk) signal is applied to the set input of an RS flip flop 20.

The setting of the RS flip flop 20 generates a high signal at its Q output. A logic circuit 24, in response, turns the transistor power switch 26 on and turns the synchronous rectifier switch 28 off. Both switches may be MOSFETs or other transistors. A diode may replace the synchronous rectifier switch 28. The logic circuit 24 ensures that there is no cross-conduction of switches 26 and 28. The input voltage Vin applied to an inductor L1 through the switch 26 causes a ramping current to flow through the inductor L1, and this current flows through a low value sense resistor 32. The ramping current is filtered by an output capacitor 36 and supplies current to the load 38. The output capacitor 36 is relatively large to smooth out ripple.

The output voltage Vo is applied to a voltage divider 42, and the divided voltage is applied to the negative input of a transconductance error amplifier 44. Capacitors may be connected across the resistors in the divider 42 to further compensate the feedback voltage. A reference voltage Vref is applied to the positive input of the amplifier 44. The output current of the amplifier 44 corresponds to the difference between the actual output voltage Vo and the desired output voltage. The voltage (a control voltage Vc) across a capacitor 46 at the output of the amplifier 44 is adjusted up or down based on the positive or negative current output of the amplifier 44. The control voltage Vc at the capacitor 46, among other things, sets the duty cycle of the switch 26, and the level of the control voltage Vc is that needed to equalize the inputs into the amplifier 44. A resistor and capacitor may be connected in parallel with the capacitor 46 for controlling and optimizing the phase and loop stability, as is well known.

The control voltage Vc is applied to a pulse width modulation (PWM) comparator 50. The ramping voltage across the sense resistor 32, when the switch 26 is on, is sensed by a differential amplifier 52, having a certain gain, and, when the output of the amplifier 52 exceeds the control voltage Vc, the PWM comparator 50 is triggered to output a reset signal to the RS flip flop 20. This turns the switch 26 off and turns the synchronous rectifier switch 28 on to discharge the inductor L1, causing a downward ramping current. In this way, the peak current through the inductor L1 for each cycle is regulated to generate a desired output voltage Vo. The current through the sense resistor 32 includes a DC component (the lower frequency, average current) and an AC component (the higher frequency, ripple current).

FIG. 1 also illustrates a conventional slope compensation circuit 59, as is well known for current mode power converters. At high duty cycles (typically greater than 50%), the slope compensation circuit 59 turns off the switch 26 before the inductor current ramp crosses the control voltage Vc to reduce sub-harmonic oscillations that may occur in the current loop at the high duty cycles. The effect of the slope compensation circuit 59 is unrelated to the present invention.

As will be described with respect to FIG. 3, switching noise (e.g., high frequency spikes and ringing) by the turning on and off of the switch 26 is coupled to the current sense circuit and causes false triggering of the PWM comparator 50, resulting in jitter and an increase of ripple on the output voltage Vo.

The voltage drop and the power dissipation across the low value sense resistor 32 become more and more significant with higher currents and lower output voltages. It is desirable to use a small value sense resistor to reduce its power dissipation. Unfortunately, providing a very low value sense resistor 32 results in a low signal to noise ratio of the sensing signal, causing imprecise switching, in addition to the switching noise problem. Furthermore, it is desirable to even eliminate the sense resistor altogether to save power loss and improve the converter efficiency.

Instead of detecting the inductor current through a sense resistor, the current through the inductor L1 may be sensed by detecting the voltage drop across the switch 26 (e.g., a MOSFET). The on-resistance of such a MOSFETs may be a few mohms. However, such sensing still results in a low signal to noise ratio of the sensing signal and imprecise switching, in addition to the switching noise problem.

FIG. 2 illustrates using the inherent DC winding resistance (DCR) of the inductor L1 to detect the inductor current. An inductor winding may have a DC resistance on the order of a few mohms. An RC network, comprising the series connection of a resistor R and capacitor C, connected across the inductor L1 is selected to have substantially the same time constant as that of the inductor and DCR so that RC=L1/DCR. Accordingly, the ramping voltage across the capacitor C will track the ramping current through the inductor L1. The voltage across the capacitor C is then sensed by the differential amplifier 52, and the remainder of the operation is the same as that described with respect to FIG. 1. The sensed voltage across the capacitor C includes a DC component (corresponding to the lower frequency, average current) and an AC component (corresponding to higher frequency, ripple current). In an application with a very low inductor DCR value, the converter of FIG. 2 suffers from the same switching noise problem and signal to noise ratio problem as described with respect to FIG. 1. Since the RC time constant must match the L1/DCR time constant for proper operation, the signal to noise ratio cannot be improved using the technique of FIG. 2.

FIG. 3 illustrates the problem with switching noise. The clock pulse 62 (Clk in FIGS. 1 and 2) turns on the switch 26 and turns off the switch 28. The switching causes a high frequency oscillation due to the various parasitic capacitances and inductances in the system. When the sensed inductor current signal rises to cross the control voltage Vc, triggering the PWM comparator 50, the switch 26 is turned off, creating switching noise. The resulting spike and oscillation can cause false triggering of the comparator 50, resulting in a jittering of the comparator 50 output. This jitter is shown by the variability 63 in the on-time 64 of the switch 26. This adversely affects the duty cycle control precision and the regulation of the output voltage Vo. The problem can become much worse in a multi-phase paralleled converter in which switching noises can be coupled among phases.

What is needed is a current sensing technique for a switching power supply that reduces the jitter stemming from switching noise and also improves the signal to noise ratio of the current sense feedback loop.

SUMMARY

Various embodiments of a current sensor for use in a current mode regulator are described.

In the example of a current mode buck regulator, the load current is equal to the average current through the inductor. The inductor current has a DC component and an AC component, where the AC component includes the ramping and any switching noise (e.g., spikes and oscillations).

In one embodiment, current sensors are provided at the power switch and the synchronous rectifier for generating a signal proportional to the switch currents. These signals also include switching noise. The signals are summed to generate a current equal to K*iL, where K is a scaling factor that is unique to the particular implementation, and iL is the instantaneous current through the switch and inductor.

The value K*iL includes the DC and AC components of the current through the inductor. The AC component of K*iL contains switching noises and is filtered (attenuated) by a first RC circuit. The output of the first RC circuit is connected across differential sense terminals of a differential amplifier whose output is a current sense signal used to determine the duty cycle of the regulator. Therefore, substantially only the DC component (the low frequency component) of the switch current is applied to the differential amplifier.

The node between the power switch and the synchronous rectifier is at Vsw (switch voltage), which is a substantially rectangular waveform going between Vin and ground at the regulator's duty cycle. This Vsw signal is applied to a series RC circuit to filter out the DC component and create a ramping AC signal that corresponds to the AC component of the inductor current, but without any switching noise. This AC component has an amplitude that is much larger than the amplitude of the AC component in the filtered K*iL signal.

The DC component (obtained from K*iL) and the "noiseless" AC component (derived from Vsw) are summed at a node and applied to the inputs of the differential amplifier. The values of the components are selected so that the DC and AC components, after being filtered by the first RC circuit, are properly scaled to recreate the inductor current. The switching noise in the AC component is virtually eliminated by using the Vsw signal rather than a switch current signal. As a result, the signal-to-noise ratio of the "current sense" signal applied to the differential amplifier is much higher than the conventional current sense signal.

The output of the differential amplifier is coupled to an input of a PWM comparator along with the output of an error amplifier to control the duty cycle, which may be the same as done in conventional current mode regulators.

In another embodiment, the DC component is obtained using a sense resistor in series with the inductor, where the voltage across the sense resistor is filtered by a capacitor to obtain the DC component. The combined AC and DC components are then applied to the differential amplifier.

In a variation of the above-described current sense circuits, the output of the PWM comparator, which triggers at the same duty cycle as the switches, is used instead of the Vsw signal to derive the AC component. The component values are appropriately scaled for the PWM comparator output.

Thus, the DC component (with all switching noise filtered out) is obtained from the actual inductor or switch current, and the AC component is derived from a rectangular waveform that does not contain switching noise.

Although the current sense circuit is particularly useful in the current feedback loop of a current mode regulator, the sensed current can also be used in a voltage mode regulator for sensing an over-current.

Other embodiments are described.

BRIEF DESCRIPTION OF THE DRAWINGS

Elements that are the same or equivalent are labeled with the same numeral.

DETAILED DESCRIPTION

Figure 1:
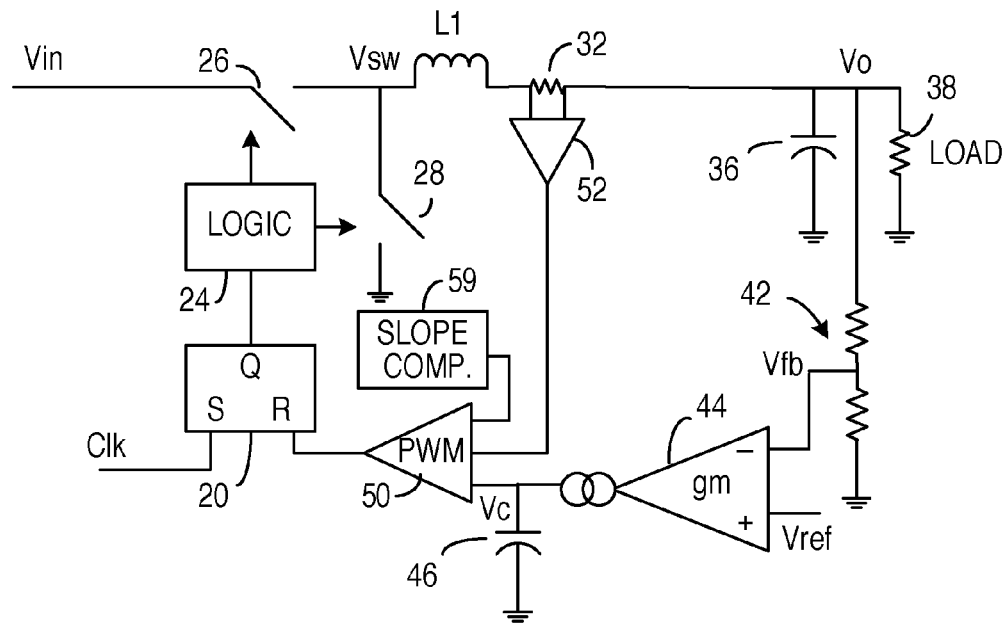
FIG. 1 illustrates a prior art DC/DC converter using a sense resistor to detect inductor current.
Figure 2:
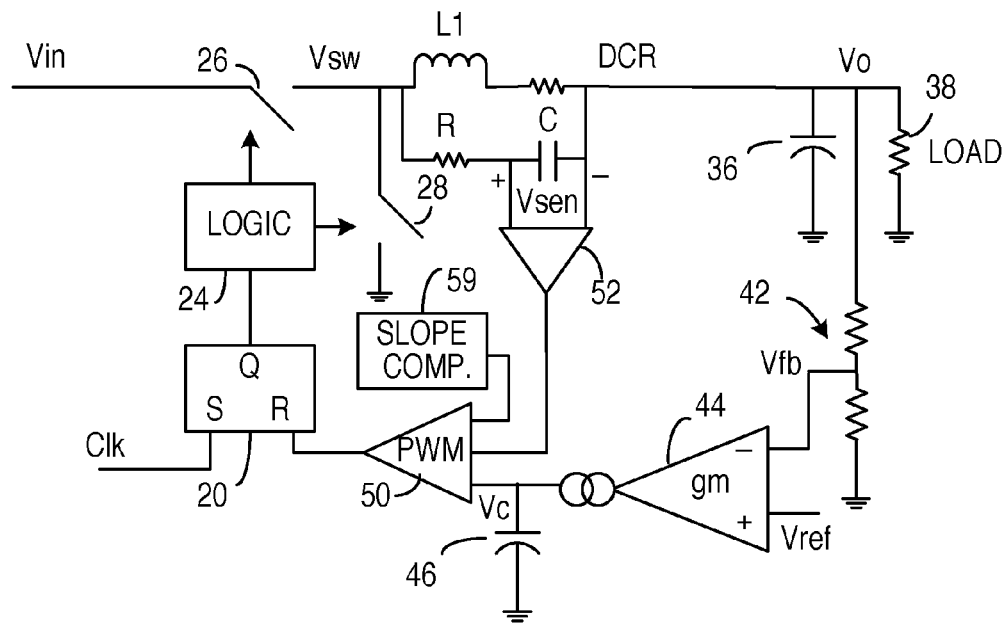
FIG. 2 illustrates another prior art DC/DC converter using the DCR of the inductor winding to detect inductor current.
Figure 3:
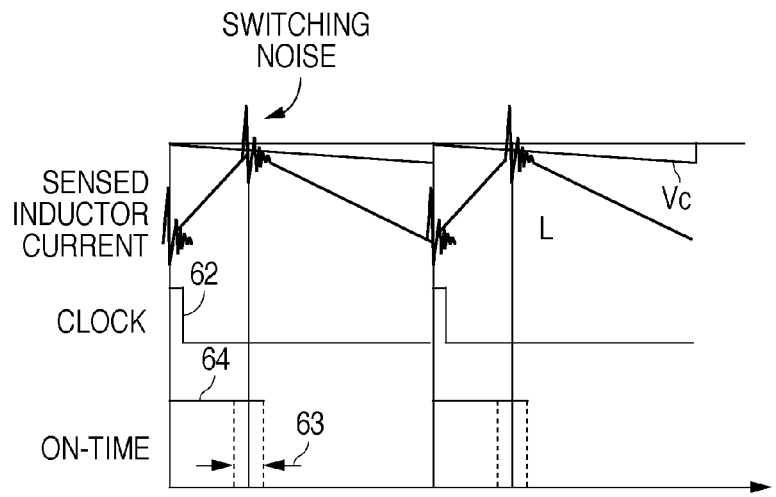
FIG. 3 illustrates the effect of switching noise on switch on-time jitter.

In the various embodiments of the invention shown in FIGS. 4-9, only the aspects of the DC/DC regulator (or converter) that are different from the regulator of FIG. 1 are shown for simplicity. Accordingly, the controller 12 in FIGS. 4-9 may be the conventional circuitry in FIG. 1 that receives the differential current sense signal (at the inputs of the differential amplifier 52), receives the voltage feedback Vfb signal (at the input of the error amplifier 44), and receives the clock signal, and then switches the MOSFETs 14 and 16 at a duty cycle required to cause the feedback voltage Vfb to equal the reference voltage Vref. The controller 12 also represents any other circuit that receives a current sense signal and uses the current sense signal to control the duty cycle in a current mode regulator. In all embodiments, the synchronous rectifier MOSFET 16 may be replaced with a diode.

Figure 4:
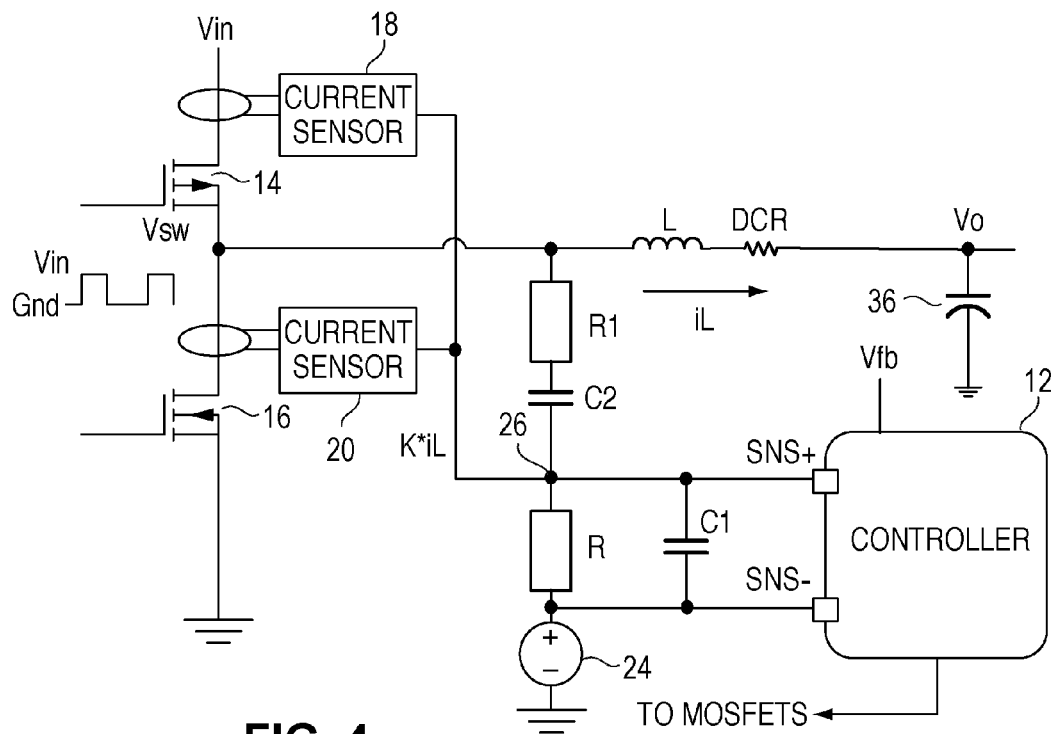
FIG. 4 illustrates a first embodiment of the invention using different RC circuits and sources for deriving the AC component and the DC component of the current sense signal.

FIG. 4 illustrates a current mode regulator using one embodiment of the inventive current sense circuit. The example is a buck regulator, but the inventive current sensor may be used in a boost regulator, a buck-boost regulator, or any other type of regulator where the current needs to be measured.

The current sense circuit generates a differential sense voltage (SNS+ and SNS-), proportional to the inductor current, for application to the controller 12. The differential sense voltage, in one example, is applied to the differential amplifier 52 (FIG. 1) within the controller 12. Any switching noise in the differential sense voltage is much lower than the switching noise that would be in the voltage across the sense resistor 32 in FIG. 1.

The circuit for deriving the DC component of the inductor current will be described first.

A first current sensor 18 detects the current through the power MOSFET 14, and a second current sensor 20 detects the current through the synchronous rectifier MOSFET 16. The current through the MOSFET 14/16 can be measured by detecting the current through a small MOSFET in parallel with the MOSFET 14/16 and then using a current mirror to generate a proportional current. Other techniques for generating a proportional current include detecting the voltage drop across a sense resistor or detecting the voltage drop across the MOSFET. The signals from the current sensors 18/20 are summed to generate a current equal to K*iL, where K is a scaling factor that is unique to the particular implementation, and where iL is the instantaneous current through the MOSFET switch and inductor L. The value K*iL includes the DC and "noisy" AC components of the current through the switch and inductor L. In one example, the value of K is 6.67×10−E6, such that one Amp through the MOSFET 14/16 causes the summed signal to equal 6.67 uA. Such a proportional current signal is conventionally generated by packaged driver/MOSFETs for any use, such as for detecting an overcurrent. An example of such a packaged driver/MOSFET is the TDA21320 by Infineon Technologies AG.

The controller 12 input has a high impedance so the K*iL current flows through a resistor R and voltage source 24 to ground. The voltage source 24 is needed so that positive and negative K*iL currents can be detected. As a result, the voltage drop across the resistor R is (K*iL)*R. This voltage is filtered by the capacitor C1 so that the AC component (which contained the switching noise) is attenuated but the DC component is not attenuated. The resulting signal is coupled to the inputs of the controller 12. The detected DC component is very accurate. The values of the resistor R and capacitor C1 are selected using the following equation: 1/(2*π*R*C1)<=0.1*Fsw, where Fsw is the switching frequency determined by the clock Clk in FIG. 1.

As seen, the DC component is obtained using a direct measurement of the switch or inductor current.

The circuit for deriving the AC component of the inductor current will now be described.

The Vsw signal at the junction of the MOSFETs 14/16 substantially goes between Vin and ground as the MOSFETs 14/16 alternately switch. The Vsw signal does not include any substantial switching noise. This "strong" rectangular waveform is applied to the series combination of resistor R1 and capacitor C1. The capacitor C2 blocks the DC component of Vsw. When Vsw goes high, the capacitor C1 charges, and when Vsw goes low, the capacitor C1 discharges. The ramping voltage across capacitor C1 is proportional to the AC ramping current through the inductor L. As a result of the "strong" Vsw waveform and the values of the components, the amplitude of the AC component of the signal provided by the R1C1C2 circuit at node 26 is much higher (e.g., >10×) than the AC component provided by the K*iL signal, so the resulting AC component applied to the controller 12 is properly scaled to the DC component. As a result, the combined DC component and AC component is proportional to the current through the inductor L but contains much less switching noise. Assuming the AC component from the R1C1C2 circuit is 10 times greater than the AC component in the K*iL signal, the switching noise in the current sense signal applied to the controller 12 is reduced by 90%.

Assuming the desired current sensing gain is Rs, the values of resistors R, R1 and capacitors C1, C2 are determined as follows:

$$R = Rs/K$$

$$C1 = 10/(2*\pi*R*Fsw)$$

$$R1 = U(K*C1*R).$$

C2 is chosen to achieve the flat current sensing gain over the frequency.

The current sense signal is applied to the controller 12, which controls the duty cycle of the MOSFETs 14/16 as previously described. The current mode regulator controls the peak current through the MOSFET 14 to generate a target output voltage Vo.

This same concept may be used in any switching circuit to derive a current that is proportional to inductor current. If the regulator is not a current mode regulator but a voltage mode regulator, the current sense signal may be used to monitor the current such as for over-current protection.

Figure 5:
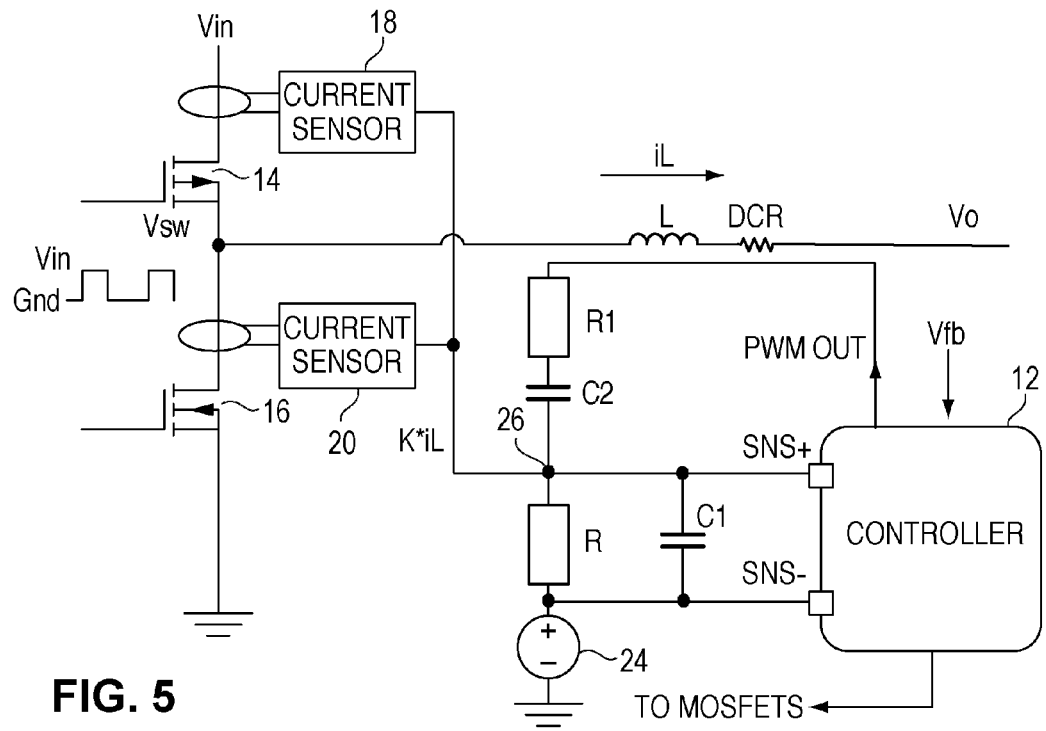
FIG. 5 illustrates a variation of the circuit of FIG. 4, where the output of the PWM comparator is used for deriving the AC component, rather than the Vsw signal.

FIG. 5 illustrates a slight variation of the circuit of FIG. 4, where the PWM comparator output (e.g., from the PWM comparator 50 in FIG. 1) is used instead of Vsw to derive the AC component of the inductor current. Since the Vsw signal tracks the PWM comparator output, the rectangular waveform applied to the R1C1C2 circuit will be the same. The values of the components are modified to take into account that the magnitude of the PWM comparator voltage swing is typically lower than the Vsw voltage swing.

Figure 6:
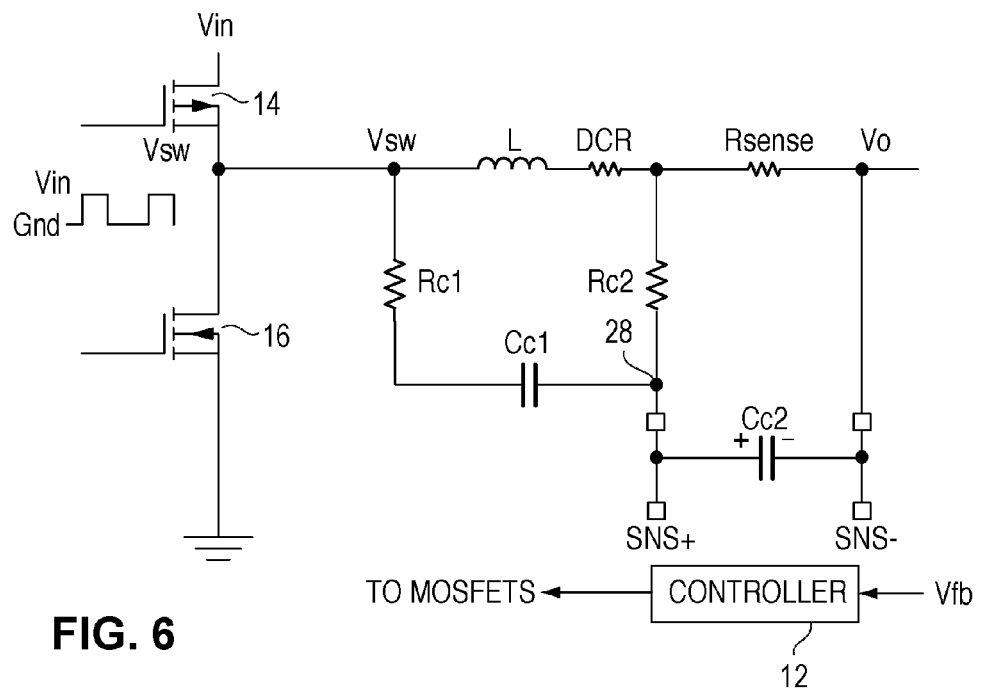
FIG. 6 illustrates another embodiment of the invention where the DC component is derived using a low value sense resistor and a filter capacitor.

FIG. 6 illustrates another embodiment of a current sensor that separately processes the DC and AC components of the inductor current to filter out the switching noise. A low value (e.g., a few milliohms) sense resistor Rsense has a voltage drop proportional to the actual current though the inductor L. This voltage across the resistor Rsense is filtered by the low-pass filter using the resistor Rc2 and the capacitor Cc2 to attenuate the "noisy" AC component but not attenuate the DC component. So, substantially only the DC component of the current sense signal from the resistor Rsense is used.

For deriving the AC component, the Vsw signal and the DCR of the inductor L are used. The Vsw signal is applied to the series combination of resistor Rc1 and capacitors Cc1 and Cc2. The capacitor Cc1 blocks the DC component of the Vsw signal.

The AC component is summed with the DC component at the node 28. Since the low-noise AC component derived from the Vsw signal has a much greater magnitude than the "noisy" AC component from the resistor Rsense, the AC component derived from the Vsw signal dominates the AC component from the resistor Rsense after filtering by the capacitor Cc2. Accordingly, the switching noise is significantly reduced (e.g., by 90%). The AC component is scaled to the DC component to generate a current sense signal proportional to the inductor current but with much less switching noise.

Figure 7:
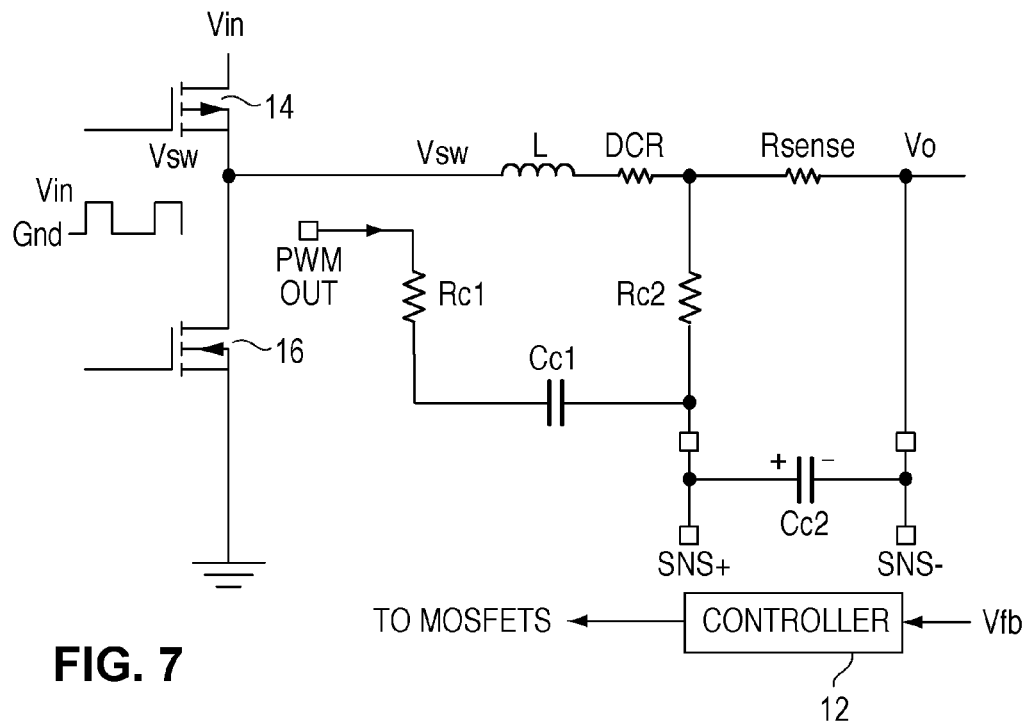
FIG. 7 illustrates a variation of the circuit of FIG. 6, where the output of the PWM comparator is used for deriving the AC component, rather than the Vsw signal.

FIG. 7 illustrates a slight variation of the circuit of FIG. 6, where the PWM comparator output (e.g., from the PWM comparator 50 in FIG. 1) is used instead of Vsw to derive the AC component of the inductor current. Since the Vsw signal tracks the PWM comparator output, the rectangular waveform applied to the Rc1Cc1Cc2 circuit will be the same. The values of the components are modified to take into account that the magnitude of the PWM comparator voltage swing is typically lower than the Vsw voltage swing.

Figure 8:
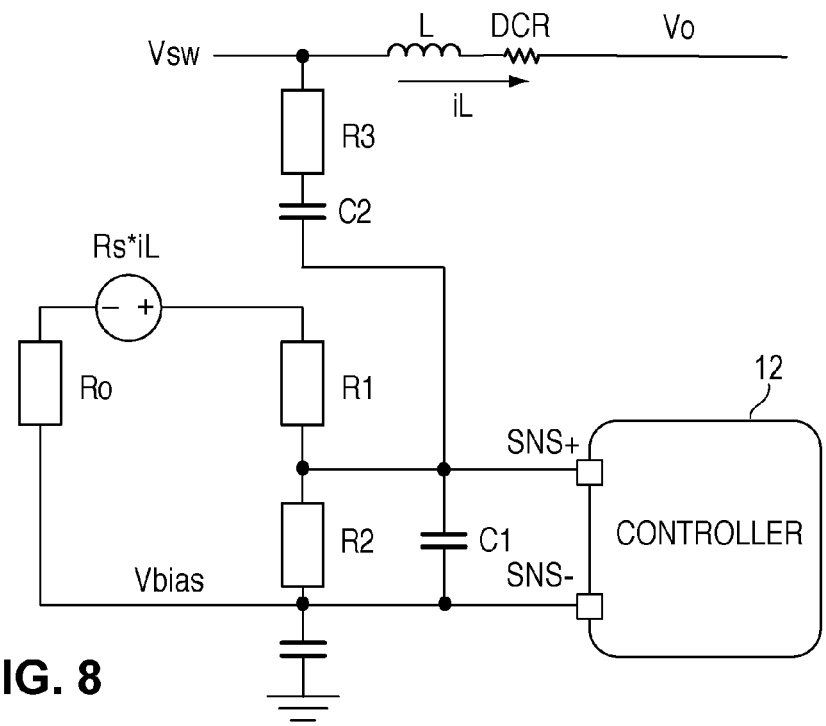
FIG. 8 is a variation of FIG. 4 where a voltage (rather than current) proportional to the total switch current is used to derive the DC component of the inductor current.

FIG. 8 illustrates an embodiment where the switch current is provided as a proportional voltage Rs*iL from the MOSFET, where Rs is the value of the equivalent current sensing gain. This voltage is divided by the resistors R1 and R2 and filtered by the capacitor C1 to supply the DC component of the inductor current to the controller 12. The AC component is derived from the Vsw signal using the R3C1C2 circuit. The AC and DC components are summed for application to the controller 12. Since the AC component derived from the Vsw signal is much greater than the "noisy" AC component in the Rs*iL signal, it dominates the resulting current sense signal after filtering by the capacitor C1.

Figure 9:
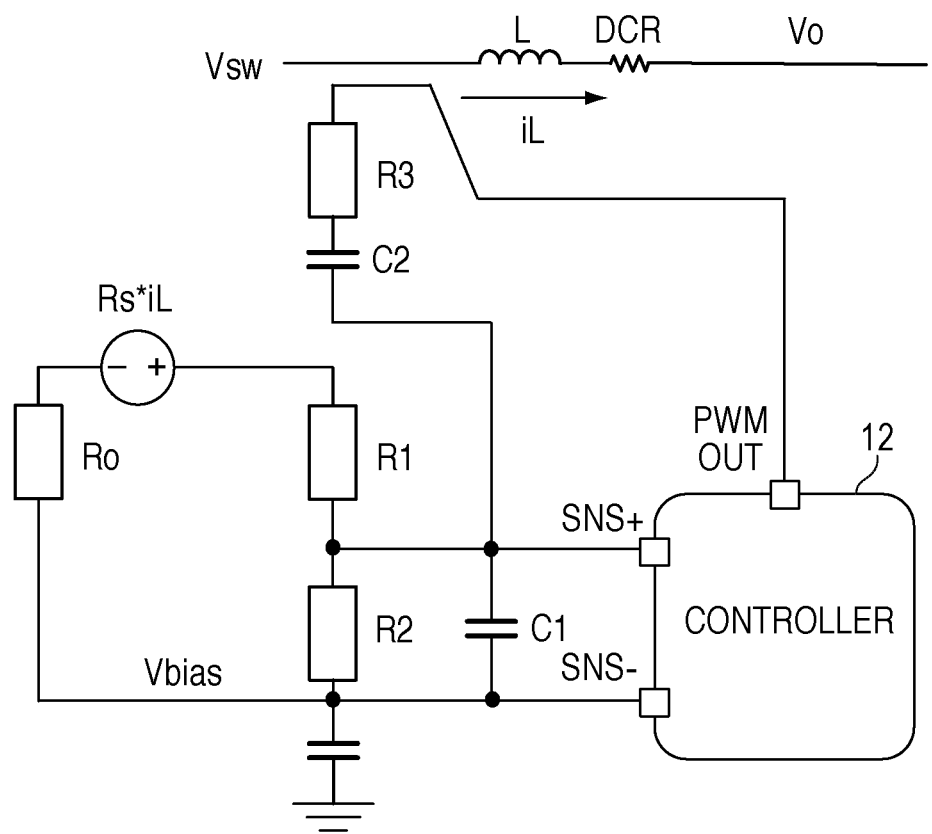
FIG. 9 is a variation of the circuit of FIG. 8, where the output of the PWM comparator is used for deriving the AC component, rather than the Vsw signal.

FIG. 9 illustrates a slight variation of the circuit of FIG. 8, where the PWM comparator output (e.g., from the PWM comparator 50 in FIG. 1) is used instead of Vsw to derive the AC component of the inductor current. Since the Vsw signal tracks the PWM comparator output, the rectangular waveform applied to the R3C1C2 circuit will be the same. The values of the components are modified to take into account that the magnitude of the PWM comparator voltage swing is typically lower than the Vsw voltage swing.

The various embodiments described herein may be combined in any way such that there are separate AC and DC sense paths, wherein the DC path uses the actual inductor current to obtain the "noiseless" DC component of the inductor current, wherein the AC path derives the AC component of the inductor current from a rectangular waveform so as not to include switching noise, and wherein the DC component and derived AC component are summed to create a current sense signal with reduced switching noise.

While particular embodiments of the present invention have been shown and described, it will be obvious to those skilled in the art that changes and modifications may be made without departing from this invention in its broader aspects and, therefore, the appended claims are to encompass within their scope all such changes and modifications that are within the true spirit and scope of this invention.

What is claimed is:

1. A circuit comprising:
   at least one switch in a voltage regulator switching at a duty cycle to supply current through an inductor to generate a target output voltage;
   a current sense circuit that generates a current sense signal that is substantially proportional to the current through the inductor, the current sense circuit comprising:
   a first portion detecting the actual current through the inductor, the first portion outputting a signal having a first AC component and a first DC component;
   a first low pass filter passing the first DC component and attenuating the first AC component;
   a second portion detecting a substantially rectangular waveform corresponding to the duty cycle of the regulator;
   a first high pass filter passing a second AC component of the substantially rectangular waveform and blocking a second DC component of the substantially rectangular waveform, wherein the second AC component is substantially proportional to a ramping current through the inductor, and wherein an amplitude of the second AC component is greater than an amplitude of the first AC component; and
   a summing node summing the second AC component, the first DC component, and the first AC component for filtering by the first low pass filter,
   wherein an output of the first low pass filter comprises the first DC component summed with an attenuated second AC component to provide a signal substantially proportional to the actual current through the inductor with reduced switching noise.

2. The circuit of claim 1 wherein the first portion comprises a sense resistor in series with the inductor, wherein a voltage across the sense resistor is proportional to the current through the inductor and contains the first AC component and the first DC component, and wherein the first low pass filter comprises a first capacitor connected to pass the first DC component and attenuate the first AC component.

3. The circuit of claim 1 wherein the first portion comprises a current sensor detecting a current through the at least one switch, the current sensor outputting a current sense signal proportional to the current through the inductor, wherein the current sense signal contains the first AC component and the first DC component, and wherein the first low pass filter comprises a first capacitor connected to pass the first DC component and attenuate the first AC component.

4. The circuit of claim 1 wherein the first portion comprises a voltage source outputting a voltage signal proportional to the current through the inductor, wherein the voltage signal signal contains the first AC component and the first DC component, and wherein the first low pass filter comprises a first capacitor connected to pass the first DC component and attenuate the first AC component.

5. The circuit of claim 1 wherein the second portion detects the substantially rectangular waveform at a terminal of the at least one switch which switches at a switching frequency of the voltage regulator, wherein the first high pass filter comprises a first capacitor in series between the terminal of the at least one switch and the summing node for blocking the second DC component and passing the second AC component.

6. The circuit of claim 1 wherein the voltage regulator is a current mode regulator, the circuit further comprising:
   a differential amplifier receiving the output of the first low pass filter, wherein an output of the differential amplifier is substantially proportional to the current through the inductor;
   an error amplifier receiving a reference voltage and a voltage corresponding to an output voltage of the regulator, the error amplifier outputting a control voltage for setting a duty cycle of the at least one switch; and
   a pulse width modulation (PWM) comparator coupled to receive the output of the differential amplifier and the control signal, an output of the PWM comparator controlling switching of the at least one switch to regulate the output voltage.

7. The circuit of claim 6 wherein the second portion detects the substantially rectangular waveform at the output of the PWM comparator, wherein the first high pass filter comprises a first capacitor in series between the output of the PWM comparator and the summing node for blocking the second DC component and passing the second AC component.

8. The circuit of claim 1 wherein the first low pass filter comprises a first resistor in parallel with a first capacitor coupled between the summing node and a reference node.

9. The circuit of claim 1 further comprising a voltage source coupled between the reference node and ground.

10. The circuit of claim 1 wherein the first high pass filter comprises a first resistor and a first capacitor connected in series between the substantially rectangular waveform and the summing node.

11. The circuit of claim 1 wherein the amplitude of the second AC component is at least ten times greater than an amplitude of the first AC component.

12. The circuit of claim 1 wherein the signal substantially proportional to the actual current through the inductor with reduced switching noise is provided in a current feedback loop of a current mode regulator.

13. The circuit of claim 1 wherein the signal substantially proportional to the actual current through the inductor with reduced switching noise is provided to detect an overcurrent in the voltage regulator.

14. A method performed by a circuit comprising:
switching at least one switch, in a voltage regulator, at a duty cycle to supply current through an inductor to generate a target output voltage;
generating a current sense signal, by a current sense circuit, that that is substantially proportional to the current through the inductor, wherein generating the current sense signal comprises:
detecting, by a first portion of the current sense circuit, the actual current through the inductor, the first portion outputting a signal having a first AC component and a first DC component;
passing, by a first low pass filter, the first DC component and attenuating the first AC component;
detecting, by a second portion of the current sense circuit, a substantially rectangular waveform corresponding to the duty cycle of the regulator;
passing, by a first high pass filter, a second AC component of the substantially rectangular waveform and blocking a second DC component of the substantially rectangular waveform, wherein the second AC component is substantially proportional to a ramping current through the inductor, and wherein an amplitude of the second AC component is greater than an amplitude of the first AC component; and
summing the second AC component, the first DC component, and the first AC component for filtering by the first low pass filter,
wherein an output of the first low pass filter comprises the first DC component summed with an attenuated second AC component to provide a signal substantially proportional to the actual current through the inductor with reduced switching noise.

15. The method of claim 14 wherein the signal substantially proportional to the actual current through the inductor with reduced switching noise is provided in a current feedback loop of a current mode regulator.

16. The method of claim 14 wherein the amplitude of the second AC component is at least ten times greater than an amplitude of the first AC component.

* * * * *